United States Patent [19]

Shimazu

[11] Patent Number: 4,706,157
[45] Date of Patent: Nov. 10, 1987

[54] SEMICONDUCTOR INTERGRATED CIRCUIT

[75] Inventor: Yukihiko Shimazu, Itami, Japan

[73] Assignee: Mitsubishi Denki Kabushiki Kaisha, Tokyo, Japan

[21] Appl. No.: 871,548

[22] Filed: Jun. 6, 1986

[30] Foreign Application Priority Data

Jun. 13, 1985 [JP] Japan .................................. 60-130205

[51] Int. Cl.⁴ .............................................. G01R 15/12
[52] U.S. Cl. ...................................... 361/86; 307/130; 324/73 R
[58] Field of Search .................... 361/86, 88, 89, 90, 361/91, 92, 56; 307/130, 296 R, 297, 350, 351; 324/73 R, 158 R

[56] References Cited

U.S. PATENT DOCUMENTS 4,336,495 6/1982 Hapke ........................... 324/73 R X
4,531,173 7/1985 Yamada ............................... 361/86
4,612,499 9/1986 Andresen et al. ................. 324/73 R

FOREIGN PATENT DOCUMENTS 216966 12/1983 Japan ..................................... 361/88

Primary Examiner—A. D. Pellinen
Assistant Examiner—Derek S. Jennings
Attorney, Agent, or Firm—Lowe Price LeBlanc Becker & Shur

[57] ABSTRACT

First and second semiconductor circuits are interconnected by a transmission circuit within an integrated circuit powered by a common voltage supply. The first semiconductor circuit is operative when the voltage applied to the integrated circuit is at a first or a second level different from a ground potential whereas the second semiconductor circuit is operative when the first level is applied and is inoperative when the second level is applied to the integrated circuit. The first semiconductor circuit controls the second semiconductor circuit selectively in test and operative modes as the applied voltage is varied between the first and second levels.

7 Claims, 3 Drawing Figures

SEMICONDUCTOR INTERGRATED CIRCUIT

BACKGROUND OF THE INVENTION

1. Field of the Invention

The present invention relates to a semiconductor integrated circuit, and more particularly, it relates to a test mode setting circuit which can facilitate to set an operation test mode in, e.g., a large-scale integrated circuit memory device.

2. Description of the Prior Art

As high integration of semiconductor integrated circuits has advanced, a number of functions have been assembled in a single chip, followed by complication in circuitry and operation.

Such a highly integrated semiconductor integrated circuit is generally multi-functional, and hence it requires a number of input/output terminals. On the other hand, such complication of the semiconductor integrated circuit reduces its observability and controllability of internal operation etc., whereby an operation test for the semiconductor integrated circuit cannot be performed with only input/output terminals generally provided therein. In order to facilitate the operation test for the semiconductor integrated circuit, therefore, it is necessary to provide the semiconductor integrated circuit with additional input/output terminals dedicated to the test for observing and controlling the internal state thereof and a circuit for aiding the operation test. However, such provision of the test-dedicated input/output terminals leads to various problems in cost and implementability. Thus, there has been proposed a method of controlling the internal state of a semiconductor integrated circuit by separating its internal state into two modes, i.e., a normal operation mode and a test mode.

FIG. 1 is a block diagram showing the structure of a test mode setting circuit in a conventional semiconductor integrated circuit proposed from the aforementioned viewpoint. An example of such a circuit is disclosed in, e.g., Japanese Patent Laying-Open Gazette No. 207648/1983.

Referring to FIG. 1, the conventional test mode setting circuit is formed by an inversion buffer 2 for inverting a signal received from a semiconductor circuit 10 performing normal circuit operation through an output signal line 1 to supply the same to an output pad 3 through a signal line 9, a delay circuit 4 for delaying a signal on the output signal line 9 from the inversion buffer 2 by a predetermined delay time to output the same, an OR gate 5 for receiving an output signal from the delay circuit 4 in one input terminal thereof and receiving a Q output signal from a D-type flip-flop 6 in its other input terminal to obtain the logical sum thereof and output the same and the D-type flip-flop 6 for receiving a signal on the signal line 1 in its input terminal D and receiving an output signal from the OR gate 5 in its clock input terminal CK while receiving a signal supplied through a signal line 8 in its reset input terminal R, to output a signal from an output terminal Q and supply the same to the semiconductor circuit 10 and the other input terminal of the OR gate 5.

The D-type flip-flop 6 outputs the signal supplied at the input terminal D from the output terminal Q on the rising edge of the signal supplied to the clock input terminal CK. The Q output from the D-type flip-flop 6 serves as an operation mode setting signal for the semiconductor circuit 10. Description is now briefly made on the operation of the conventional circuit as shown in FIG. 1.

In a normal operation mode, the D-type flip-flop 6 outputs the signal of logic "0" from the output terminal Q. A signal supplied from the semiconductor circuit 10 on the output signal line 1 is transferred to the output pad 3 through the inversion buffer 2 while being supplied to the delay circuit 4. The delay circuit 4 delays the output signal received from the inversion buffer 2 by a predetermined delay time $t_p$ to supply the same to one input terminal of the OR gate 5. The OR gate 5 obtains the logical sum of the Q output from the D-type flip-flop 6 and the output signal from the delay circuit 4 to supply its output to the clock input terminal CK of the D-type flip-flop 6. The D-type flip-flop 6 outputs the signal supplied in its D input terminal responsive to the rising edge of the signal supplied to the clock input terminal CK from the output terminal Q. The Q output of the D-type flip-flop 6 is reset at logic "0" in the normal operation mode, and hence the OR gate 5 supplies the output (logic "1") of the delay circuit 4 to the clock input terminal CK of the D-type flip-flop 6 at this time.

On the rising edge (transition from "0" to "1") of the output from the delay circuit 4, the signal on the signal line 1 has changed to "0" before the time $t_p$. Therefore, the D-type flip-flop 6 always outputs the signal of logic "0" from its output terminal Q with no regard to the signal state on the output signal line 1.

In a test mode, a signal of logic "1" appearing on the output signal line 1 is detected by a detecting means (not shown) to forcibly supply the signal of logic "1" to the output pad 3. The Q output of the D-type flip-flop 6 is still "0" at this time, and hence the signal of logic "1" forcibly supplied onto the output pad 3 is supplied to the clock input terminal CK of the D-type flip-flop 6 through the delay circuit 4 and the OR gate 5. Therefore, the signal supplied to the clock input terminal CK of the D-type flip-flop 6 rises from "0" to "1" by the forcibly supplied signal of logic "1", whereby the D-type flip-flop 6 outputs the signal of logic "1" currently on the output signal line 1 from the output terminal Q. The signal of logic "1" from the output terminal Q of the D-type flip-flop 6 is supplied as a test mode command signal to the semiconductor circuit 10 through the signal line 7.

The Q output signal from the D-type flip-flop 6 once converted to "1" is supplied to the clock input terminal CK thereof through the OR gate 5, and hence the D-type flip-flop 6 always outputs the signal of logic "1" from its output terminal Q.

In order to return the circuit from the test mode into the normal operation mode, a system reset is performed to supplying a reset signal to the reset terminal R of the D-type flip-flop 6 through the reset signal line 8, thereby to return the Q output of the D-type flip-flop 6 to "0".

In the test mode setting circuit of the above construction, conversion from the normal operation mode to the test mode must be performed at the time when the output signal on the output signal line 1 is of logic "1", and it is difficult to control such timing of conversion. Further, once the circuit enters the test mode, the entire semiconductor integrated circuit must be reset through a system reset to return the same to the normal operation mode, and it has been impossible to test the circuit operation by temporarily stopping the normal operation of the circuit, i.e., through interruption by the test mode.

TOKE U22 84-059009/10 J5 9016-414-A, "Power-On Reset Circuit", Tokyo Shibaura Denki K. K., 20.07.82-JP-126109 discloses a circuit which operates in a similar manner to a test mode setting circuit according to the present invention. The circuit disclosed in the aforementioned reference is similar to the present invention in that the circuit performs significant operation in accordance with changes in the supply potential level. However, the power-on reset circuit of the above prior art functions only when the supply potential is raised from 0 V to 5 V upon application of power, while the circuit according to the present invention functions when the supply potential is changed from, e.g., 5 V to 8 V and from 8 V to 5 V, i.e., upon bidirectional changes of the supply potential including increase and decrease.

SUMMARY OF THE INVENTION

It is an object of the present invention to overcome the aforementioned disadvantages of the prior art and provide a semiconductor integrated circuit which can facilitate to set a test mode for a semiconductor circuit performing normal operation without increasing the number of input/output terminals.

It is another object of the present invention to provide a semiconductor integrated circuit which can detect abnormal fluctuation of the supply potential.

The semiconductor integrated circuit according to the present invention comprises:

a first circuit employing a potential supplied to a power supply potential point as operation source potential to perform normal operation, a second circuit performing no operation when a first potential is supplied to the supply potential point while performing operation when a second potential is supplied thereto, to output a signal at a level responsive to the first or second potential, and a transmission circuit for transmitting the output from the second circuit to an operation mode setting input terminal of the first circuit.

In the aforementioned structure, the second circuit is inoperable and exerts no influence on the first circuit when the first potential is supplied to the supply potential point, whereby the first circuit operates in a normal operation mode. When, on the other hand, the second potential is supplied to the supply potential point, the second circuit operates to generate a signal, which is transmitted to the operation mode setting input terminal of the first circuit through the transmission circuit, whereby the first circuit operates in a mode different from the normal operation mode.

These and other objects, features, aspects and advantages of the present invention will become more apparent from the following detailed description of the present invention when taken in conjunction with the accompanying drawings.

DESCRIPTION OF THE PREFERRED EMBODIMENT

An embodiment of the present invention is now described with reference to the drawings.

Figure 1:
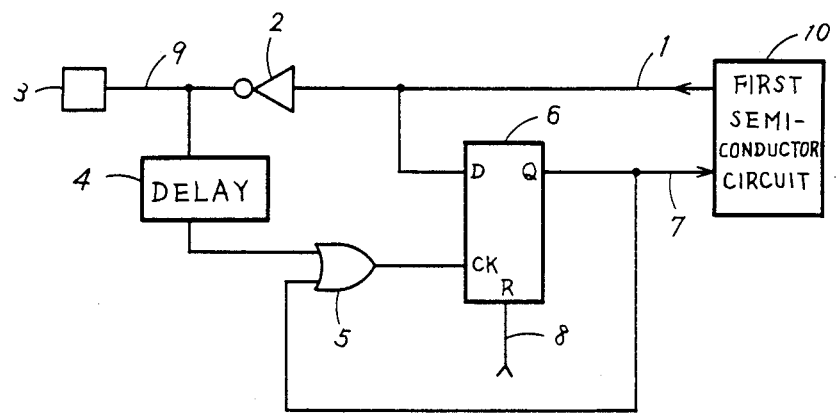
FIG. 1 is a block diagram showing the structure of a conventional test mode setting circuit.
Figure 2:
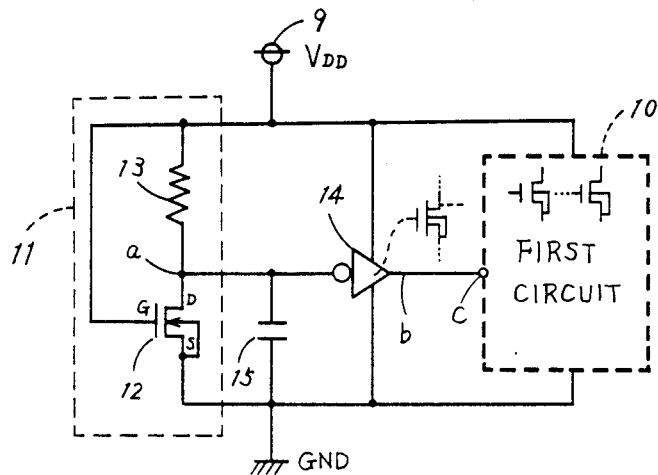
FIG. 2. illustrates the structure of a semiconductor integrated circuit according to an embodiment of the present invention.

FIG. 2 illustrates the structure of a semiconductor integrated circuit according to the embodiment of the present invention.

Referring to FIG. 2, the semiconductor integrated circuit according to the present invention includes a first circuit 10 which employs a potential $V_{DD}$ supplied to a supply potential point 9 as an operating source to perform normal operation along the design specification, a second circuit 11 which is inoperable when a first potential (5 V in this embodiment) is supplied to the supply potential point 9 and operable when a second potential (8 V in this embodiment) is supplied thereto and a transmission circuit 14 for transmitting an output signal from the second circuit 11 to the first circuit 10 through a node c of an operation mode setting input terminal.

The first circuit 10 is a logic circuit or the like whose main circuit component is a MOS transistor having a first threshold voltage (about 1 V in this embodiment), which becomes operable when the first and second potentials are supplied to the supply potential point 9.

The second circuit 11 is provided with an n-channel MOS transistor 12, which has a drain D connected to the supply potential point 9 through a load element 13, a source S connected to the ground potential GND and a gate G connected to the supply, potential point 9.

The threshold voltage (about 6 V in this embodiment) of the MOS transistor 12 is set to be higher than that of the MOS transistor included in the first circuit 10. The threshold voltage of the MOS transistor 12 can be controlled by ion injection etc. into a channel region.

The transmission circuit 14 is formed by an inversion buffer having an input terminal connected to the drain D of the MOS transistor 12 through a node a and an output terminal coupled to the first circuit 10 through node b, c which inversion buffer employs the potential $V_{DD}$ as its operating source potential to supply a operation mode command signal. This inversion buffer forming the transmission circuit 14 is an inverter formed by MOS transistors each having a threshold voltage (1 V in this embodiment) operable by the first potential, and a threshold voltage for a buffer is set at about 2 V.

A capacitor 15 for noise elimination is provided between the input terminal of the transmission circuit 14 and the ground potential GND.

Figure 3:
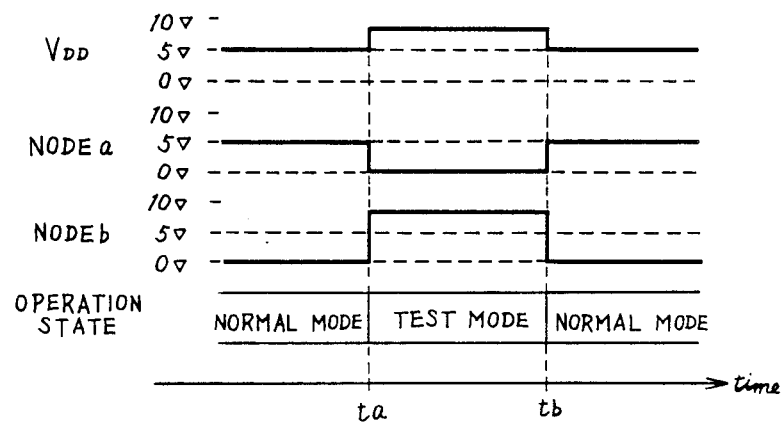
FIG. 3 is an operation waveform diagram of the circuit as shown in FIG. 2.

FIG. 3 is a waveform diagram showing the operation of the circuit as shown in FIG. 2. With reference to FIGS. 2 and 3, description is now made on the operation of the semiconductor integrated circuit according to the present invention.

In the normal operation mode, the first potential (5 V) is supplied to the supply potential point 9 as shown in FIG. 3. The second circuit 11 performs no operation at this time. That is, the threshold voltage of the MOS transistor 12 is set to be higher than the first potential, and hence the gate-to-source voltage of the MOS transistor 12 is lower than the threshold voltage thereof, whereby the MOS transistor 12 is in an OFF state. Thus, the first potential supplied to the supply potential point appears on the output terminal (node a) of the second circuit 11. The first potential on the node a is inverted by the transmission circuit 14, whereby the ground potential GND, i.e., 0 V appears on the node b (output terminal of the transmission circuit 14). The potential of 0 V on the node b is supplied to an operation mode setting input terminal c of the first circuit 10. As the result, the first circuit 10 receives the first potential from the supply potential point 9 to operate in the normal operation mode, similarly to the conventional case.

In the test mode (between times $t_a$ and $t_b$), the second potential (8 V) is supplied to the supply potential point 9 by means not shown, whereby the second circuit 11 becomes operable. That is, the gate-to-source voltage of the MOS transistor 12 becomes higher than the threshold voltage thereof, whereby the MOS transistor 12 enters an ON state. Consequently, the potential on the node a becomes the ground potential GND (0 V). The potential on the node a is inverted by the transmission circuit 14 to be outputted to the node b, the potential on which becomes the second potential (8 V). The second potential on the node b is transmitted to the first circuit 10 through the node c as a test mode command signal. In response to the test mode command signal, the first circuit 10 operates in the test mode.

In order to return the circuit from the test mode to the normal operation mode (time $t_b$ in FIG. 3), the potential supplied to the supply potential point 9 is returned from the second potential to the first potential by means not shown. Thus, the second circuit 11 performs no operation, i.e., the MOS transistor 12 enters a nonconductive state, and the ground potential GND of 0 V appears on the node b as shown in FIG. 3. As the result, the first circuit 10 returns from the test mode operating state to the normal mode operating state. For the means for changing the power supply potential, any means is available, such as externally applying the second potential to the supply potential point 9, or internally generating it with an on-chip circuit.

Thus, setting the potential supplied to the supply potential point 9 into the first or the second potentials readily causes the first circuit 10 to operate in the normal operation mode or the test mode without increasing the number of input/output terminals while ignoring the timing for conversion from the normal operation mode to the test mode.

Although the second circuit 11 is used as a test mode command signal generator in the aforementioned embodiment, the second circuit 11 may serve as an abnormal supply potential detecting signal generator which generates an abnormal potential detecting signal for protecting, e.g., the first circuit 10 when abnormal high voltage that might damage the first circuit is applied to the supply potential point 9.

According to the present invention as hereinabove described, the second circuit is provided to be inoperable when the first potential is supplied to the supply potential point and operable when the second potential is supplied thereto while the transmission circuit is provided to transmit a signal to the first circuit upon operation of the second circuit, whereby the first circuit can be readily driven to operate in an operation mode different from the normal operation mode when the potential supplied to the supply potential point is changed, without increasing the number of terminals and without affecting the signal states of the input and output terminals other than the power supply terminal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
   a supply potential receiving means for receiving a first potential and a second potential different from a common reference potential, and reference receiving means for receiving said reference potential;
   a first circuit coupled to said supply potential receiving means to be operable upon supply of either one of said first and second potentials to said potential receiving means;
   a second circuit coupled to said supply potential receiving means to be inoperable upon supply of said first potential to said supply potential receiving means and operable upon supply of said second potential to said supply potential receiving means; and
   a transmission circuit coupled between said first circuit and said second circuit to transmit a signal to said first circuit upon operation of said second circuit to change an operating mode of said first circuit.

2. A semiconductor integrated circuit in accordance with claim 1, wherein
   said second potential is higher than said first potential,
   said first circuit is mainly composed of first MOS transistors operable by said first potential and each having a first threshold voltage, and
   said second circuit is mainly composed of a second MOS transistor inoperable through said first potential and operable through said second potential, said second MOS transistor having a second threshold voltage higher than said first threshold voltage.

3. A semiconductor integrated circuit in accordance with claim 2, wherein
   said second circuit is provided with a MOS transistor having a drain connected to said supply potential receiving means through a load element, a source connected to the ground potential and a gate connected to said supply potential receiving point.

4. A semiconductor integrated circuit in accordance with claim 1, wherein
   said transmission circuit is formed by an inversion buffer which receives output from said second circuit to invert and output the same.

5. A semiconductor integrated circuit in accordance with claim 2, wherein
   said transmission circuit is an inverter formed by third MOS transistor means to be operatable by said potential supplied to said supply potential receiving means and having an input part connected to the drain of said second MOS transistor, said third MOS transistor means having said first threshold voltage.

6. A semiconductor integrated circuit in accordance with claim 1, wherein
   said second circuit is a circuit for generating a signal for driving said first circuit to operate in a test mode.

7. A semiconductor integrated circuit in accordance with claim 1, wherein
   said second circuit is a circuit for detecting an abnormal potential at said supply potential receiving means.

* * * * *

UNITED STATES PATENT AND TRADEMARK OFFICE
CERTIFICATE OF CORRECTION

PATENT NO.  :  4,706,157
DATED       :  November 10, 1987
INVENTOR(S) :  Yukihiko SHIMAZU It is certified that error appears in the above-identified patent and that said Letters Patent is hereby corrected as shown below:

```
The title is misspelled on both the title page at
[54] and again at the top of column 1.  The correct
title should read:

SEMICONDUCTOR INTEGRATED CIRCUIT
```

Signed and Sealed this

Twenty-ninth Day of August, 1989

Attest:

DONALD J. QUIGG

*Attesting Officer*  *Commissioner of Patents and Trademarks*